(12) United States Patent
Niess et al.

(10) Patent No.: US 9,252,011 B2
(45) Date of Patent: Feb. 2, 2016

(54) METHOD FOR FORMING A LAYER ON A SUBSTRATE AT LOW TEMPERATURES

(75) Inventors: Juergen Niess, Sontheim (DE); Wilfried Lerch, Dornstadt (DE); Wilhelm Kegel, Laichingen (DE); Alexander Gschwandtner, Munich (DE)

(73) Assignee: Centrotherm Photovoltaics AG, Blaubeuren (DE)

( * ) Notice: Subject to any disclaimer, the term of this patent is extended or adjusted under 35 U.S.C. 154(b) by 0 days.

(21) Appl. No.: 14/131,943

(22) PCT Filed: Jul. 12, 2012

(86) PCT No.: PCT/EP2012/002947
§ 371 (c)(1),
(2), (4) Date: Mar. 11, 2014

(87) PCT Pub. No.: WO2013/007389
PCT Pub. Date: Jan. 17, 2013

(65) Prior Publication Data
US 2014/0179117 A1   Jun. 26, 2014

(30) Foreign Application Priority Data

Jul. 12, 2011   (DE) .................. 10 2011 107 072

(51) Int. Cl.
| H01L 21/31 | (2006.01) |
| H01L 21/02 | (2006.01) |
| C23C 8/10 | (2006.01) |
| C23C 8/36 | (2006.01) |
| C23C 8/38 | (2006.01) |
| H01J 37/32 | (2006.01) |

(Continued)

(52) U.S. Cl.
CPC ............ *H01L 21/02238* (2013.01); *C23C 8/10* (2013.01); *C23C 8/36* (2013.01); *C23C 8/38* (2013.01); *H01J 37/3222* (2013.01); *H01J 37/32192* (2013.01); *H01L 21/02164* (2013.01); *H01L 21/02252* (2013.01); *H01L 21/67115* (2013.01); *H01L 31/02167* (2013.01); *H01L 31/18* (2013.01); *Y02E 10/50* (2013.01)

(58) Field of Classification Search
CPC .................. H01L 21/02252; H01L 21/02274; H01L 21/02238; H01L 21/0223; H01J 37/32192; H01J 37/32211; H01J 37/32229
See application file for complete search history.

(56) References Cited

U.S. PATENT DOCUMENTS

| 5,281,557 A | 1/1994 | Yu |
| 5,492,735 A | 2/1996 | Saito |

(Continued)

FOREIGN PATENT DOCUMENTS

WO    2010/0015385    2/2010

*Primary Examiner* — Michael Trinh
(74) *Attorney, Agent, or Firm* — Tarolli, Sundheim, Covell & Tummino LLP

(57) ABSTRACT

A method for forming an oxide layer on a substrate is described, wherein a plasma is generated adjacent to at least one surface of the substrate by means of microwaves from a gas containing oxygen, wherein the microwaves are coupled into the gas by a magnetron via at least one microwave rod, which is arranged opposite to the substrate and comprises an outer conductor and an inner conductor. During the formation of the oxide layer, the mean microwave power density is set to $P=0.8-10$ W/cm$^2$, the plasma duration is set to $t=0.1$ to 600 s, the pressure is set to $p=2.67-266.64$ Pa (20 to 2000 mTorr) and a distance between substrate surface and microwave rod is set to $d=5-120$ mm. The above and potentially further process conditions are matched to each other such that the substrate is held at a temperature below 200° C. and an oxide growth is induced on the surface of the substrate facing the plasma.

10 Claims, 5 Drawing Sheets

(51) Int. Cl.
　　　*H01L 21/67*　　(2006.01)
　　　*H01L 31/0216*　(2014.01)
　　　*H01L 31/18*　　(2006.01)

(56) References Cited

U.S. PATENT DOCUMENTS

| | | | |
|---|---|---|---|
| 6,399,520 | B1 | 6/2002 | Kawakami et al. |
| 6,652,709 | B1 | 11/2003 | Suzuki et al. |
| 7,381,595 | B2 | 6/2008 | Joshi et al. |
| 7,645,999 | B2 * | 1/2010 | Descamps et al. ........ 250/423 R |
| 2006/0269291 | A1 | 11/2006 | Kagawa et al. |
| 2007/0026540 | A1 | 2/2007 | Nooten et al. |
| 2007/0045244 | A1 * | 3/2007 | Lee et al. ................. 219/121.43 |
| 2009/0263919 | A1 | 10/2009 | Hori et al. |
| 2010/0247805 | A1 | 9/2010 | Kabe et al. |
| 2011/0217849 | A1 * | 9/2011 | Lerch et al. .................... 438/758 |
| 2013/0081762 | A1 * | 4/2013 | Zhao et al. ............... 156/345.34 |

* cited by examiner

METHOD FOR FORMING A LAYER ON A SUBSTRATE AT LOW TEMPERATURES

RELATED APPLICATIONS

This application corresponds to PCT/EP2012/002947, filed Jul. 12, 2012, which claims the benefit of German Application No. 10 2011 107 072.2, filed Jul. 12, 2011, the subject matter of which is incorporated herein by reference in their entirety.

BACKGROUND OF THE INVENTION

The present invention relates to a method forming a layer on a substrate, in particular a semiconductor substrate and at temperatures below 200° C.

SUMMARY OF THE INVENTION

In the manufacture of electronic components, such as memory chips, microprocessors, but also in the photovoltaic industry or in the area of flat screens, different production steps for manufacturing the final product are necessary. During the manufacture of the products, different layers for forming the electronic components are applied. An important class of these layers is dielectric layers, which insulate different layers from each other. With these dielectric layers, as well as with all other layers, it is necessary to form the same without faults and in a reliable manner in order to secure the functionality of the components.

For forming dielectric layers or other layers on a substrate, different methods are known. One example of such a method is the formation of thermal oxide layers on semiconductor substrates in so-called ovens or in rapid thermal processing devices (RTP-devices). In such devices, dielectric layers with good electrical characteristics may be formed in a controlled manner.

One problem associated with such a thermal oxidation may inter alia be the used temperature at which the oxidation is performed as it may impair the underlying structures. Therefore, in such systems there is a desire that the thermal budget of the processing is reduced, for example by a specifically rapid heating and/or cooling of the substrate. This measure, however, is only suitable to a limited extent. Furthermore, the layer formation, in particular in a thermal oxidation, may be influenced by the orientation of the semiconductor crystals. For example, in polycrystalline silicon substrates or with three-dimensional structures this may lead to inhomogeneous layer thicknesses and the development of undesired structure formation.

Furthermore, a plasma treatment of substrates for forming dielectric layers is known. U.S. Pat. No. 7,381,595 B2 for example describes a low temperature plasma oxidation of a silicon semiconductor using high density plasma. In this patent, the plasma source, which will be called a plasma electrode in the following, is formed by two plate-shaped electrodes, which are arranged opposite to each other. The substrates are placed between the two plate-shaped electrodes which are arranged in an opposed manner and the substrates themselves form a part of one of the electrodes. The temperatures used during the plasma oxidation substantially reduce the thermal budget over a thermal oxidation and the problems related with the thermal budget are therefore improved. A similar plasma electrode arrangement, which is formed by two plate-shaped electrodes arranged in an opposed manner, and in which a substrate to be treated is placed between the electrodes, is known from U.S. Pat. No. 6,037,017 A. In this plasma electrode, the distance between the electrodes may be adjusted depending on different process parameters. Further plasma electrodes of this type are known from U.S./2007/0026540 A1, U.S. Pat. No. 5,492,735 and U.S. Pat. No. 5,281,557.

The plasma oxidation described in these patents may, however, lead to an inhomogeneous oxide layer and in particular, the electrical characteristics of the layers thus formed may be insufficient.

In WO 2010/015385 A an alternative, rod shaped microwave plasma electrode is described. The microwave plasma electrode has an inner conductor and an outer conductor, which completely surrounds the inner conductor in a first partial region thereof. Adjacent to this first partial region a second partial region is provided, in which the outer conductor provides an opening, which widens towards the free end thereof. In the region of the widening opening, microwave power for generating a plasma is emitted. Another rod shaped plasma electrode having an inner conductor, an outer conductor and an emission structure is for example known from DE 197 22 272. Such rod shaped plasma electrodes may be arranged in a manner that it is opposite to the substrate to be treated and the substrate is not arranged between the electrodes for generating the plasma. With such plasma electrodes, better treatment results may be achieved.

Further developments in the manufacture of semiconductors require in several areas the manufacture of dielectric layers, especially of $SiO_2$ at lower temperatures. Typical applications, where the manufacture of oxides should be performed at temperatures below 200° C., in order not to impair previously formed layers, are for example TSVs (Through Silicon Vias) in the backend field, or the manufacture of transistors in accordance with the GateFirst method, and also in accordance with the GateLast method. Furthermore, current and future 3D chip structures require the growth of good conformal $SiO_2$ layers and the re-oxidation of conformal $Si_3N_4$ layers, respectively. Hereby, the quality of the oxides produced at these temperatures has to be high. In the above referenced methods, oxides with high quality may typically only be manufactured at high temperatures (above 700° C.) or medium temperatures (300-700° C.).

In the previously known plasma oxidation, which in part enable the manufacture of high quality oxides at medium temperatures (300-700° C.), a heating of the substrate caused by the plasma was taken as given and was not seen as a problem. The processes were designed such that medium temperatures (300-700° C.) were allowed and sometimes desired, in order to grow oxides of high quality. With an increase in integration and scaling of the semiconductor structures, this is no longer possible. The required alternative materials and also the smaller dimensions do not necessarily allow such temperatures of 300-700° C.

Starting from the above cited art, it is an object of the present invention to provide a method for forming an oxide layer on a substrate at temperatures below 200° C.

In accordance with the present invention, a method for forming an oxide layer on a substrate in accordance with claim 1 is provided. Further embodiments of the invention may inter alia be found in the dependent claims.

The method comprises generating a plasma adjacent to at least one surface of the substrate, wherein the plasma is formed by means of microwaves from a gas or mixture of gases containing oxygen, wherein the microwaves are coupled to the gas which is present in a process chamber by at least one magnetron via at least one microwave rod, which is arranged opposite to the substrate, and which comprises an outdoor conductor and an inner conductor. During the method, at least the following process conditions are set:
mean microwave power density P=0.8-10 W/cm²
plasma duration t=0.1-600 s;
process chamber pressure p=2.67-266.64 Pa (20-2000 mTorr);
distance between the substrate surface and the microwave rod d=5-120 mm, wherein the above mentioned and possibly further process conditions are matched to each other such that the substrate is held at a temperature below 200° C. and an oxide growth is induced on the surface of the substrate facing the plasma. The distance between the substrate surface to the microwave rod is measured in accordance with one embodiment, in which the microwave rod is surrounded by a dielectric tube, for example made of quartz, from the tube and otherwise from the outer surface of the microwave rod. The plasma duration relates to the total time at which the plasma is present, which may also be achieved by a pulsed plasma formed by a plurality of successive plasmas. The medium microwave power density takes changes during the process into consideration.

Preferably, the values are controlled as follows: medium microwave power density P=0.9-10 W/cm², plasma duration t=0.1-300 s (in particular t=0.1-150 s), process chamber pressure p=10.67-133.32 Pa (80-1000 mTorr), and distance between substrate surface and microwave rod d=8-80 mm.

The above set of variables enables the manufacture of oxides of high quality at temperatures below 200° C. The main force behind the oxidation in this method is an electrical potential generated on the substrate by the microwave plasma, which acts independent of the structure of the substrate surface. In the plasma oxidation described here, the substrate is heated by the plasma, although this effect is of a secondary nature. It is allowed that the substrate is also heated to a temperature below 200° C., depending on the process conditions. The idea underlying the invention is to choose the process variables (distance, pressure, time, power) such that the oxides are grown with the required thicknesses at low temperatures (below 200° C.).

In view of the low growth temperature in combination with the microwave plasma used, a high conformity during the growth in technologically relevant areas may be achieved and an improved interface quality is achieved due to reduced diffusion. The oxide thus formed is typically very dense and can also be used as a diffusion barrier. The method also enables a re-oxidation of silicon nitride. Due to the small growth temperature, almost no re-distribution of dopants in previously formed layers occurs during the oxide growth. The electrical quality of the layer formed by this method is comparable to the one of thermal oxides. If it were desired to lower the temperature in the thermal oxidation method, one would have to use a wet oxidation using a high [OH]-proportion, which would, however, lead to a degradation of the quality of the layer. The minimum temperature for a thermal oxide growth would still be well above the temperature region considered for the present method. As previously mentioned, the main driving force behind the plasma oxidation in this method is the electrical potential formed on the substrate. Since this electrical potential acts independent of the surface structure of the substrate surface, a high conformity is given and very good corner rounding is achieved, for example for oxides for Shallow Trench Isolation, Deep Trenches or Nano Wires.

For an oxide growth of <4.5 nm at a substrate temperature of T<200° C., the above mentioned process conditions are set such that they fulfill the following equation:

$$P^A \cdot t^B \cdot p^C \cdot \exp(-(d-d_0)/\lambda) < K,$$

wherein the parameters of the equation are defined as follows:
$d_0$ is a distance offset in [mm] in the range of 0-30,
$\lambda$ is a characteristic length in [mm] in the range of 30-120,
A, B and C are choosable coefficients in the range
A=0.8-1.5; B=0.5-1.3; and C=−1−−0.3, and
K is a constant in the range of 11-4. For example the distance coefficient may correspond to the depth of penetration of the microwaves into the space surrounding the microwave rod, and the characteristic length may correspond to a decreasing density of the plasma, ions or electrons.

The mean microwave power density is given in [W/cm²], the plasma duration t is given in [s], the chamber pressure p is given in [Pa] and the distance between plasma rod and wafer is given in [mm].

Preferably, the previously mentioned parameters are in the following ranges:
$d_0$=0-10 mm; $\lambda$=35-80 mm; A=1-1.2; B=0.8-1; C=−0.8−−0.7; and K=8-4.

In one embodiment of the invention, the parameters are controlled to be at
$d_0$=0 mm; $\lambda$=70 mm; A=1.1; B=0.9; C=−⅔; and K=4.

The mean microwave power density P for generating the plasma should be at least 0.8 W/cm², in order to achieve a sufficiently high electrical potential for oxidation.

Preferably, the plasma is generated via a microwave rod which is supplied with microwaves from a single side, wherein the outer conductor forms an opening, which widens towards a free end of the electrode. Such a microwave rod enables a particularly homogeneous plasma. At least one corresponding microwave rod could also be arranged on the opposite side of the substrate to generate a plasma adjacent to the other side of the substrate.

In order to achieve a good oxidation, the gas contains $O_2$ or an arbitrary mixture of $H_2/O_2$ in the amount of 6-100%, wherein the rest may be an inert gas (for example Ar, He, Xe, Kr). Alternatively, the gas may also contain N2, NO, $N_2O$, $NH_3$ or $D_2$.

In order to reduce heating of the substrate by the plasma, a grid structure may be provided between the at least one microwave rod and the substrate, which is cooled during at least part of the method, in which the plasma is generated. It is also possible to cool the substrate during the method via its backside.

The above method is particularly suitable for the oxidation of a silicon substrate of arbitrary form and dimension.

BRIEF DESCRIPTION OF THE DRAWINGS

The invention will be described herein below with reference to the drawings. In the drawings.

DESCRIPTION OF EMBODIMENTS

The relative terms such as for example left, right, above and below as used in the subsequent description refer to the drawings and these terms should not limit the application, even though they may relate to preferred arrangements.

Figure 1:
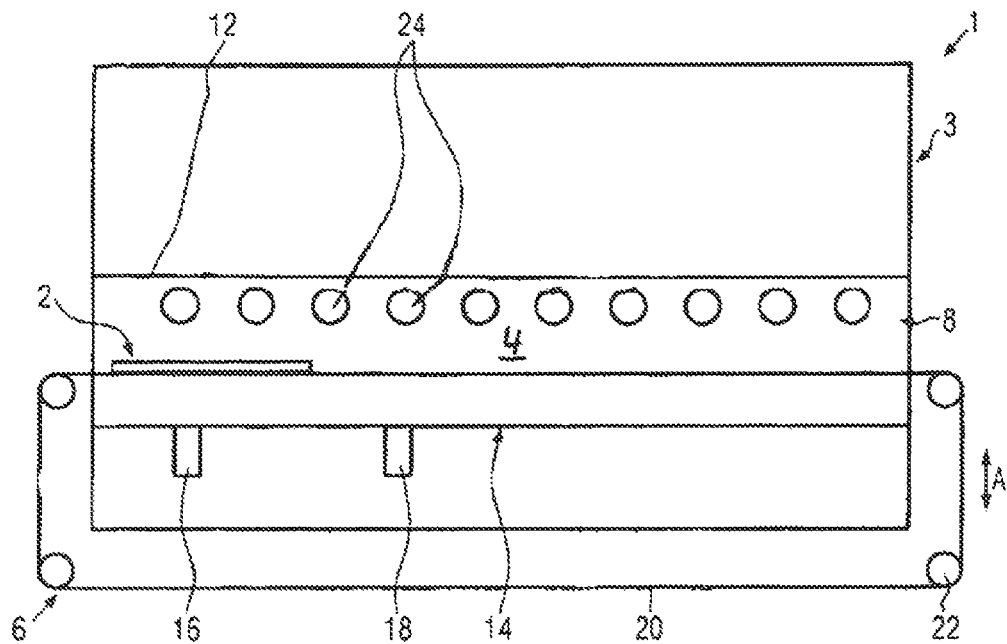
FIG. 1 is a schematic sectional view of an apparatus for performing the inventive method.

FIG. 1 shows a schematic sectional view of an apparatus 1 for forming dielectric layers, in particular oxide layers on a substrate 2. The apparatus 1 has a vacuum housing 3, which is only shown as an outline, which defines an elongated process chamber 4 of the line type, i.e. the type in which a substrate is transported through the process chamber during processing. The apparatus 1 further comprises a transport mechanism 6 and a plasma unit 8. Additionally, a cooling unit may be provided, which is arranged in the vicinity of the transport mechanism.

As the substrate 2, different substrates and in particular semiconductor substrates such as silicon substrates may be provided with an oxide layer in the apparatus 1. During the formation of the oxide layer, the substrate may be at least partially surrounded by a protective element, not shown, which is arranged in the same plane as the substrate, in order to avoid edge effects during the forming of the oxide layer and to virtually enlarge the physical surface of the substrate. The protective element should comprise the same or at least similar physical characteristics as the substrate. The vacuum housing 3 has suitable locks for inserting and removing the substrates 2 into/from the process chamber 4.

The process chamber 4 is inter alia bounded by an upper wall 12 and a lower wall 14. The upper wall 12 is for example made of aluminum and treated such that metallic contaminations or particles in the process chamber are avoided. The upper wall 12 and the lower wall 14 extend in substance parallel to each other, but they may also have areas which are angled with respect to each other, as is for example known from the not pre-published DE 10 2011 100 024, which is incorporated herein by reference with respect to this aspect. An angled wall section could be arranged such that the process chamber tapers from an input end to an output end and then a straight section in which the upper and lower walls are parallel may follow.

In the vicinity of the lower wall 14 a vacuum pump 16 is provided, via which the process chamber 4 may be evacuated. The pump may also be provided at a different location and several pumps may be provided. Furthermore, in the vicinity of the lower wall 14 a pyrometer 18 for measuring the temperature of the substrate 2 is provided. In lieu of a pyrometer, also a different temperature measuring device may be provided at a different location of the process chamber or directly at the substrate 2, which for example may also measure the temperature of the substrate 2 from the top. Also, more than one temperature measuring device may be provided. The process chamber 4 furthermore has a gas feed conduit, not shown, via which a process gas may be conducted into the process chamber 4.

The transport unit 6 consists in substance of an endless transport belt 20, which is guided via a plurality of guide rollers and/or transport rollers 22 in a rotating manner. The normal direction of rotation for a treatment of the substrate 2 is a clockwise direction, but it is also possible to rotationally move the transport belt counter clockwise. Hereby, an upper transport section of the transport belt 20 is arranged such that it extends in a straight manner throughout the process chamber 4. Thus, a substrate 2 is moved from left to the right through the process chamber 4. The return path of the transport belt 20 is outside of the process chamber 4, in order to for example apply cooling and/or cleaning processes to the transport belt 20. The transport belt 20 should preferably be arranged completely within the vacuum area, but with a suitable arrangement, it could also be arranged partially outside of the vacuum area. In lieu of a transport belt 20, the transport unit 6 may also comprise a different transport mechanism, such as transport rollers or a magnetic drive.

The transport unit 6 may optionally be moved up and down as a whole, as shown by the double arrow A. In so doing, it is possible to place the transport unit 6 and in particular its transport section closer to the upper wall 12 or closer to the lower wall 14, as will be explained in more detail herein below.

The plasma unit 8 is arranged within the process chamber 4. The plasma unit 8 consists of a plurality of plasma electrodes 24. The plasma electrodes are formed as microwave rods. The microwave rods are of a type which is supplied with microwaves from a single side, as is for example known from WO 2010/015385 A, which is incorporated herein by reference with respect to the construction of the preferred microwave rod. In particular, the microwave rod comprises an inner conductor, which in a first section is completely surrounded by an outer conductor. Adjacent to this section, another section is provided, in which the outer conductor provides an opening, which widens towards the free end of the outer conductor. In the section of the widening opening, microwave power for generating a plasma is emitted. In the drawing all together ten microwave rods are provided, which are supplied with microwaves via magnetrons, which are not shown. It is possible that two microwave rods may be supplied with microwaves via a common magnetron.

The microwave rods may have one or several plasma ignition device(s). The plasma rods may also have a different construction with respect to the inner and outer conductors, which allows microwaves to be emitted.

The design of the plasma rods may be chosen such that a plasma generated thereby is limited in its extension (in particular in a longitudinal direction of the plasma rods) and thus does not contact the walls of the process chamber. If this were happening, undesired reactive species may be generated, which could lead to metal contaminations of the substrate. By using aluminum as a material for the process chamber, a respective contamination may also be avoided, as long as a critical bombardment energy of 14 eV of species exiting the plasma is not exceeded.

The plasma rods 24 each extend perpendicular to the plane of the drawing, i.e. transverse through the process chamber 4. Form left to right, i.e. from an input end to an output end of the process chamber 4, the plasma rods are arranged with equal spacing. The above described apparatus is designed as an inline device.

Figure 2:
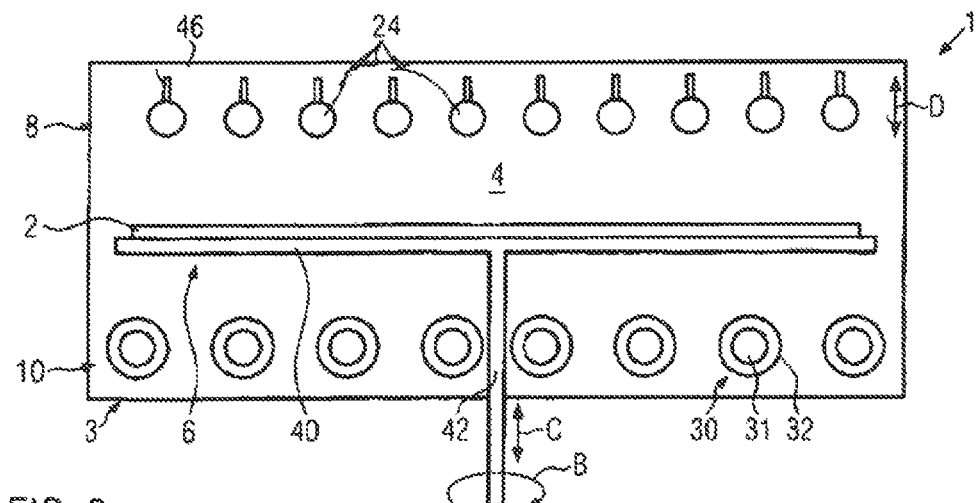
FIG. 2 is a schematic sectional view of an alternative apparatus for performing the inventive method.

FIG. 2 shows a schematic sectional view of an alternative apparatus 1 for forming layers on a substrate 2 in accordance with an alternative embodiment. In the description of this embodiment, the same reference signs are used, inasmuch as the same or similar elements are referred to.

The apparatus 1 again has a housing, which is only schematically shown at 3. The housing 3 is again a vacuum housing and may be evacuated via a vacuum unit, which is not shown.

Within the housing 3 a process chamber 4 is defined. The apparatus 1 further comprises a substrate carrier unit 6, a plasma unit 8 as well as an optional heating unit 10. The carrier unit 6 comprises a substrate receptacle 40, which is rotatably supported within the process chamber 4 via a shaft 42, as indicated by arrow B. The shaft 42 is connected to a rotating unit, which is not shown. Furthermore, the shaft 42 and thus the receptacle 40 is movable in an up and down direction, as is shown by the double arrow C. Hereby, the receiving plane of the receptacle 40 may be moved within the process chamber 4 upwards and downwards, respectively, as will be explained in more detail herein below.

The plasma unit 8 again consists of ten plasma rods 24, which may be of the same type as previously described. The plasma rods may again be supplied with power in pairs via magnetrons, which are not shown. The plasma rods 24 may optionally be supported in the process chamber 4 in a manner in which they are individually movable up and down via respective guides 46, as is shown by the double arrow D. In such a case, the up and down movability of the carrier unit 6 may be dispensed with, but could also be additionally provided. Hereby, local changes of the distance between the plasma electrode 24 and the substrate 2 are possible. In particular, it is thus possible, in combination with the rotation of a substrate 2 via the carrier unit 6 to provide for example in an edge region of the substrate 2 larger or smaller distances in comparison to a central section thereof. Furthermore, it would be beneficial, if the plasma electrodes 24 and/or the lamps 31 extend over the dimensions of the substrate 2, i.e. extend across the edges the substrate 2. Again, a protective device may be provided, which surrounds the substrate 2 at least partially in its plane to avoid edge effects. The protective device may be arranged in a fixed manner or may also be rotatable.

Even though not shown, a grid may be provided between the plasma rods 24 and the substrate 2, which grid may be cooled via a cooling device which is not shown, in order to attenuate a heating effect of a plasma on the substrate. The grid may optionally be made of an electrically conducting material, in order to be able to generate an electric bias on the grid. For example, different electrical biases may be applied to the grid via a corresponding control unit. Both, setting the distance between the plasma electrode 24 and the substrate 2 as well as applying different electrical biases to a grid as described above, may influence the interaction between a plasma and the substrate, as described in the above cited DE 10 2011 100 024.

The optional heating unit 10, which is typically not used for the method in accordance with the invention, but for other processes, which may be conducted in the apparatus 1, consists of a plurality of radiation sources 30, which may be arranged in parallel or also perpendicular to the plasma electrodes 24. The radiation sources each comprise a lamp, such as an arc lamp or a halogen lamp, which is surrounded by a quartz tube 32.

The apparatus 1 preferably includes at least one temperature measuring unit, in order to determine the temperature of the substrate 2. The determined temperature may be provided to a control unit, not shown, which may control in a closed loop different process parameters in accordance with a temperature requirement, in order to bring the substrate temperature to a predetermined value and in particular to keep the same under a predetermined maximum value.

FIGS. 3 to 6 show curves of time dependent temperature increases of a wafer during a plasma oxidation in the apparatus 1 of FIG. 2 at different process conditions.

Figure 3:
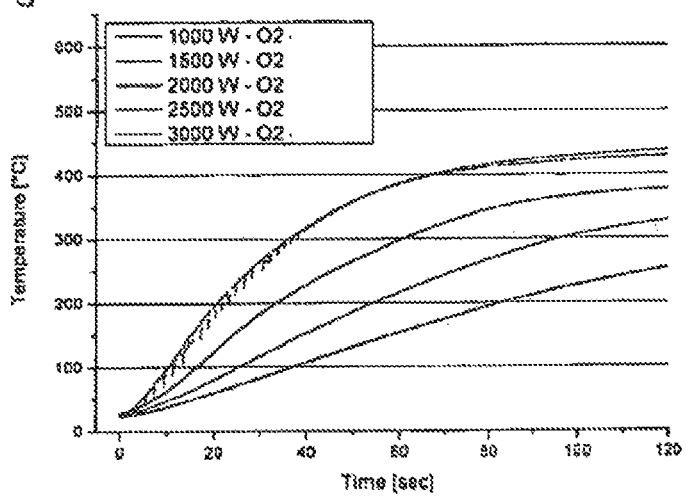
FIGS. 3 to 6 are curves of time dependent temperature increases of a wafer during a plasma oxidation.

FIG. 3 shows the temperature increase of a 300 mm wafer during a plasma oxidation at 34.67 Pa (260 mTorr), a distance between the plasma rods and the wafer of 20 mm and a pure $O_2$-atmosphere. Hereby the distance is measured from the dielectric tube surrounding the plasma rods. The different curves correspond to different powers of the magnetrons, wherein altogether five magnetrons are provided, which each supply microwaves to two microwave rods. The curves show that higher powers of the magnetrons, at least after some time, lead to higher temperatures. Hereby, also an allocation of the curves to the given power values for the magnetrons is possible. The curve for a power of 3000 W per magnetron generates the highest temperature value after 120 s and the curve for a power of 1000 W per magnetron generated the lowest temperature value.

Figure 4:
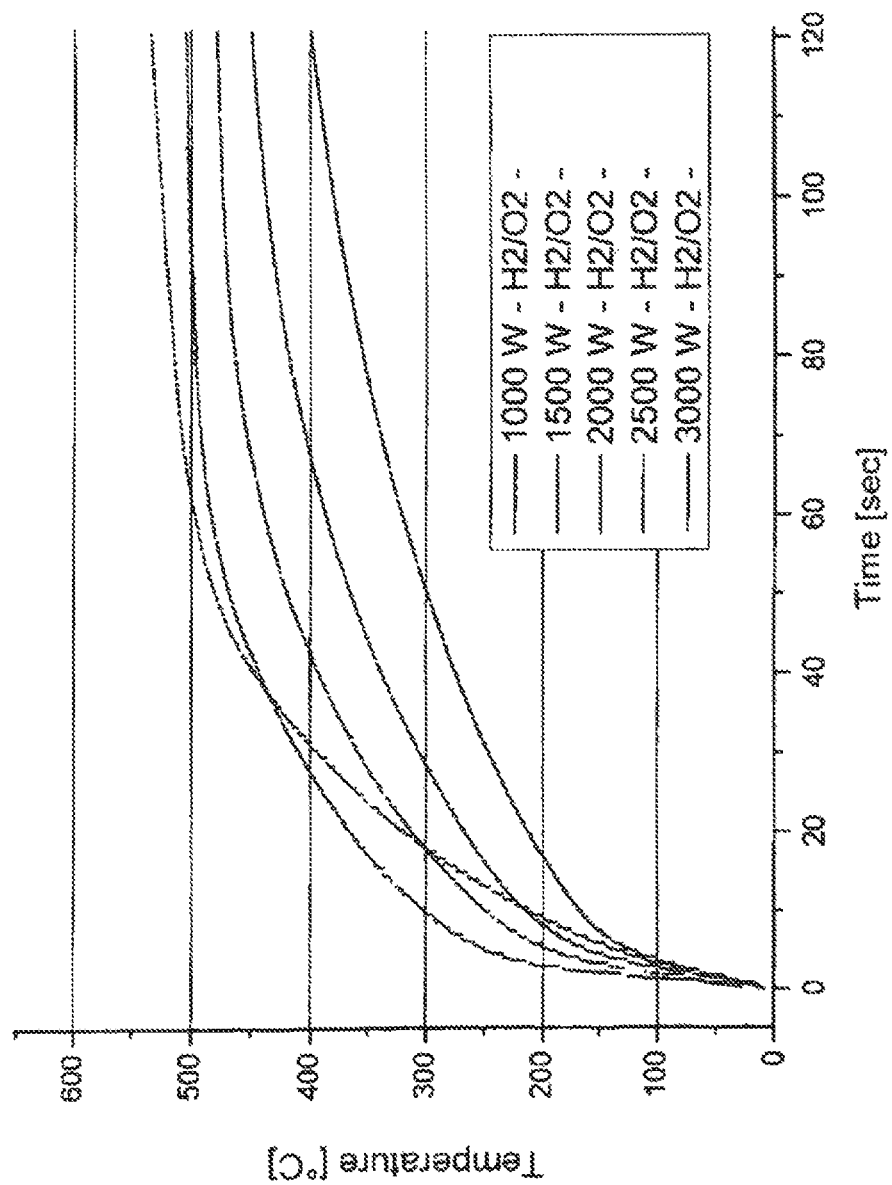

FIG. 4 shows similar to FIG. 3 the temperature increase of a 300 mm wafer during a plasma oxidation at 34.67 pa (260 mTorr), and a distance between the plasma rods and the wafer of 20 mm. This time the oxidation was performed in a pure $H_2/O_2$-atmosphere having a ratio of the mixture of 1:1. The curves show that in a pure $O_2$-atmosphere in comparison to an $H_2/O_2$-atmosphere at otherwise the same conditions, lower temperatures are reached.

Figure 5:
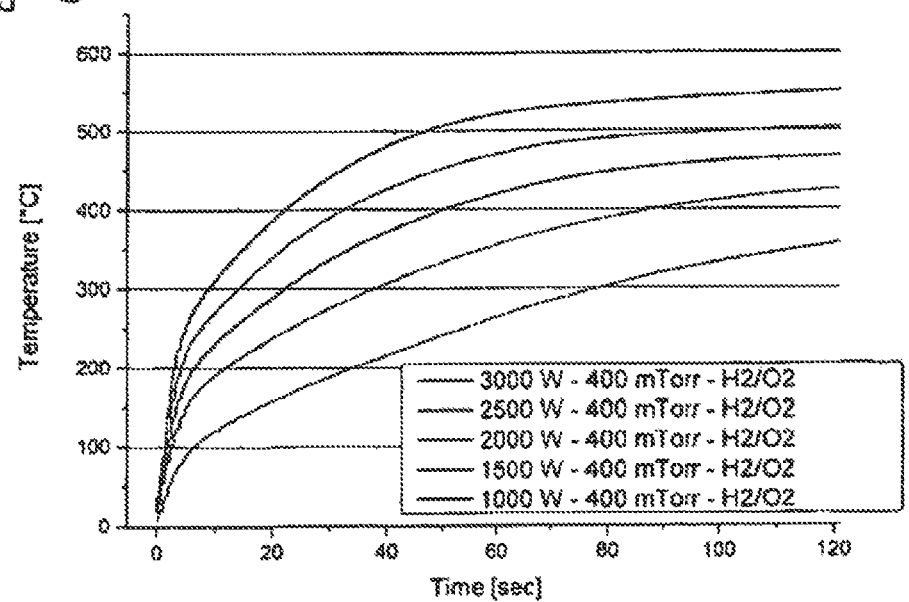

FIG. 5 shows similar to FIG. 4 the temperature increase of a 300 mm wafer during a plasma oxidation, this time at 53.33 Pa (400 mTorr), a distance between the plasma rods and the wafer of 20 mm in a pure $H_2/O_2$-atmosphere at a ratio of the mixture of 1:1. The curves show that again higher powers of the magnetron, at least after some time, lead to higher temperatures. In particular, they also show a faster and higher heating of the wafers.

Figure 6:
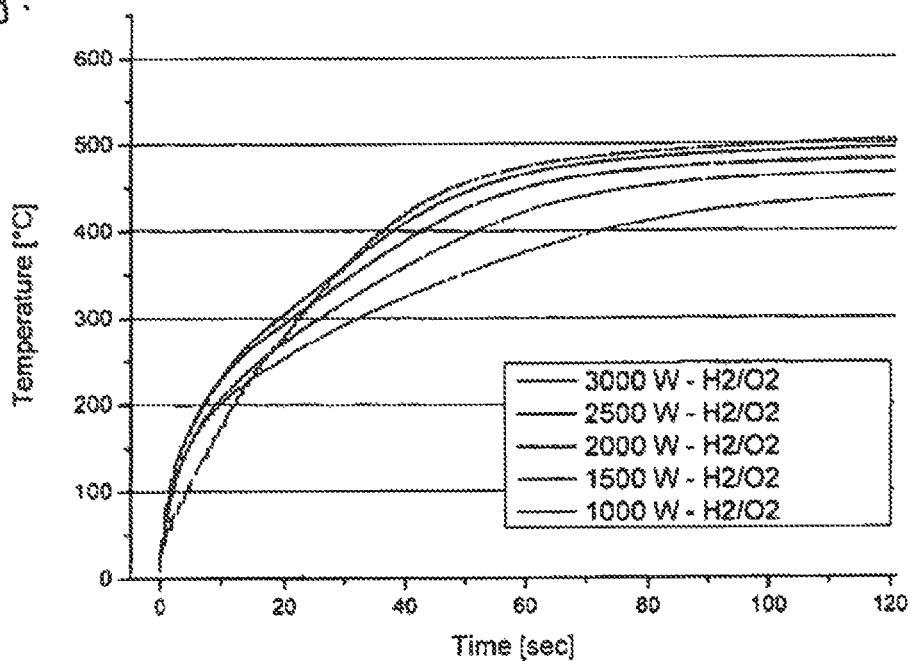

FIG. 6 shows similar to FIG. 5 the temperature increase of a 300 mm wafer during a plasma oxidation at 13.87 Pa (104 mTorr) a distance between the plasma rods and the wafer of 20 mm in a pure $H_2/O_2$-atmosphere having a ratio of the mixture of 1:1. The curves again show that with higher powers of the magnetrons, at least after some time, higher temperatures are reached. In particular, the curves also show a faster and most times higher heating of the wafers in comparison to FIG. 4. In substance, the curves of FIGS. 5 and 6 are closer to each other, which points to the fact that at lower pressures, the dependence on the power is reduced due to a larger expansion of the plasma.

Figure 7:
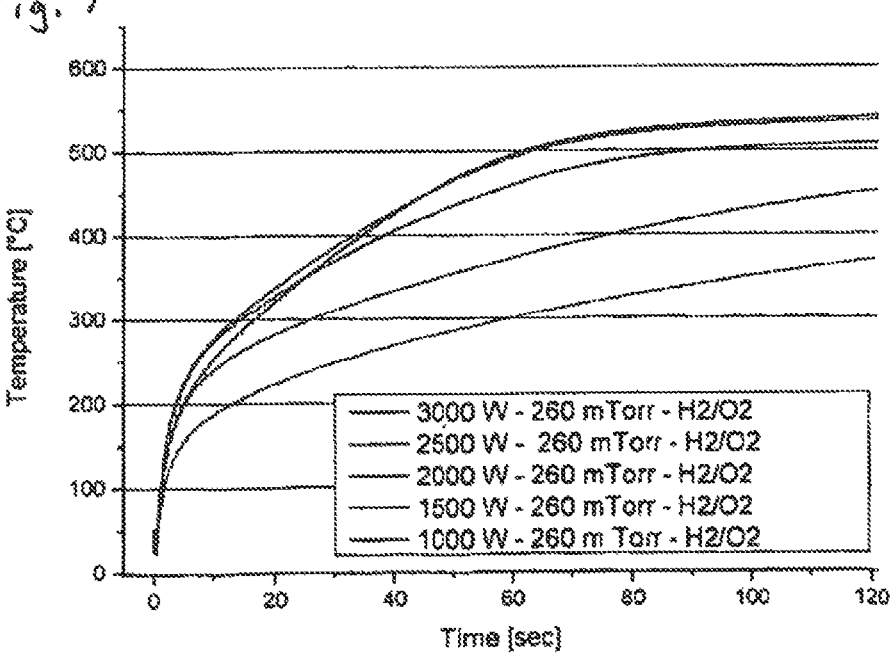
FIG. 7 is a curve of a wafer temperature versus oxide growth on a wafer during a plasma oxidation.

FIG. 7 shows similar to FIG. 6 the temperature increase of a 300 mm wafer during a plasma oxidation at 34.67 Pa (260 mTorr) a distance between the plasma rods and the wafer of 60 mm in a pure $H_2/O_2$-atmosphere having a ratio of the mixture of 1:1. The curves show again, that higher powers of the magnetrons, at least after some time, lead to higher temperatures. The curves in particular also show for lower powers a shallower curve, which would appear to be caused by the larger distance between plasma and substrate.

From the above exemplary curves, possible process conditions for an oxidation at a temperature below 200° C. may be extracted and the oxide layer thicknesses grown under these conditions may be determined.

Figure 8:
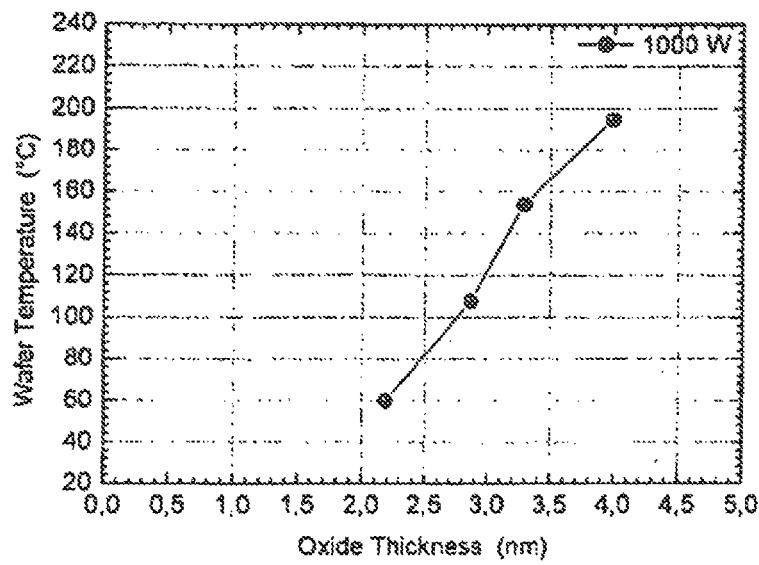
FIG. 8 is a curve of a time dependent oxide growth on a wafer during a plasma oxidation at a substrate temperature below 200° C.

FIG. 8 shows a curve of a wafer temperature versus oxide growth on a wafer during a plasma oxidation. FIG. 8 in particular shows an exemplary curve of the dependence of the wafer temperature (below 200° C.) on the grown oxide thickness at the process conditions according to FIG. 3 and a power of the magnetrons of 1000 W.

Figure 9:
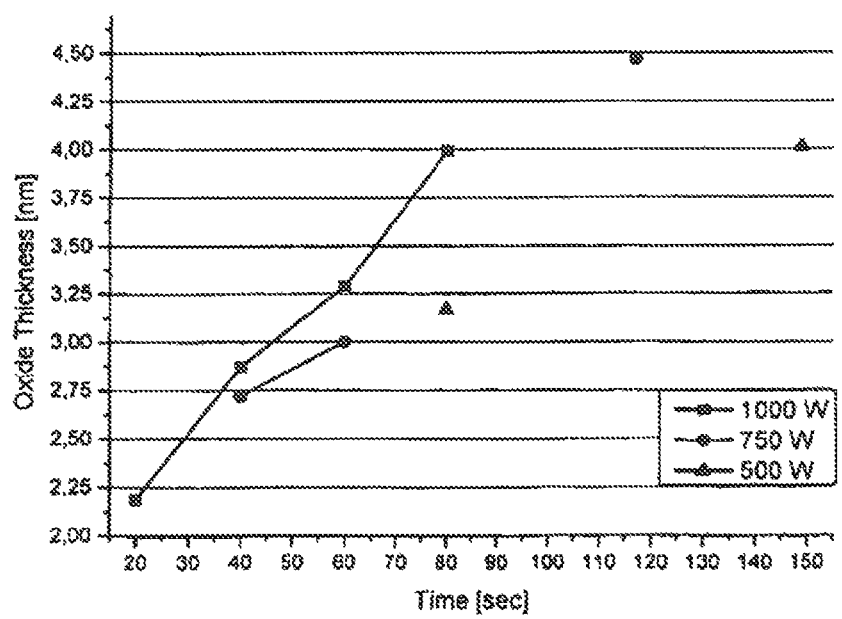
FIG. 9 shows curves of a time dependent oxide growth on a wafer during a plasma oxidation at the process conditions of FIG. 3 and different powers of the magnetrons.

FIG. 9 shows curves of a time dependent oxide growth on a wafer during a plasma oxidation at the process conditions of FIG. 3 and different powers of the magnetrons. It can be seen, that at the above described conditions and a 1000 W power per magnetron (i.e. 500 W per plasma rod) and a process time of up to 80 s an oxide having a thickness of up to 4 nm may be grown, while the wafer temperature is always kept at 200° C. If the power per magnetron is reduced to 750 W, oxide thicknesses of up to 4.5 nm may be grown within 120 s, wherein the wafer temperature is again always kept below 200° C. With powers of 500 W per magnetron, oxide thicknesses of up to 4 nm may be achieved in a time of up to 150 s, wherein again the wafer temperature is always kept below 200° C.

FIGS. 3 to 8 only show some curves, from which the inventors have extracted a set of variables which enables a low temperature oxidation of a substrate at temperatures below 200° C. The set of variables contains different sellable process conditions, which each influence a plasma oxidation. The set of variables is valid for a plasma oxidation in which a plasma is generated by means of microwaves from a gas or mixture of gases containing oxygen, wherein the microwaves are coupled into the gas or mixtures of gases which is provided in a process chamber via a microwave rod, which is arranged opposite the substrate and which comprises an outer conductor and an inner conductor.

The set of variables comprises the following process conditions: mean microwave power density $P=0.8\text{-}10$ W/cm², plasma duration $t=0.1\text{-}600$ s, process chamber pressure $p=2.67\text{-}266.64$ Pa (20-2000 mTorr) and a distance between the substrate surface and the microwave rod of $d=5\text{-}120$ mm. In particular, the variables should comprise the following values: mean microwave power density $P=0.8\text{-}10$ W/cm², plasma duration $t=0.1\text{-}300$ s (in particular $t=0.1\text{-}150$ s), process chamber pressure $p=10.67\text{-}133.32$ Pa (80-1000 mTorr), and distance between substrate surface and microwave rod $d=8\text{-}80$ mm. The above and potentially further process conditions have to be matched to each other such that the temperature of the substrate is kept below 200° C. and an oxide growth is induced on the surface of the substrate facing the plasma.

Such a corresponding matching is for example given for an oxide growth of <4.5 nm at a substrate temperature of T<200° C., if the following equation is fulfilled:

$$P^A \cdot t^B \cdot p^C \cdot \exp(-(d-d_0)/\lambda) < K,$$

wherein the mean microwave power density P is given in [W/cm²], the plasma duration t is given in [s], the process chamber pressure p in [Pa] and the distance plasma source to surface of the wafer d is given in [mm]. The parameters of the equation are defined as follows:

$d_0$ is a distance offset in [mm] in the range of 0-30 mm,
$\lambda$ is a characteristic length in [mm] in the range of 30-120 mm,
A, B and C are choosable coefficients in the range of
A=0.8-15;
B=0.5-1.3;
C=-1--0.3, and
K is a constant in the range of 11-4. Hereby, the distance coefficient may for example be a penetration depth of the microwaves into the space surrounding the microwave rod and the characteristic length may correspond to a decreasing density of the plasma, ions or electrons.

Preferably, the following parameters should be at: $d_0=0\text{-}10$ mm; $\lambda=35\text{-}80$ mm; A=1-1.2; B=0.8-1; C=-0.8--0.7; and K=8-4. In particular these parameters could have the following values: $d_0=0$ mm; $\lambda=70$ mm; A=1.1; B=0.9; C=-⅔; and K=4.

The parameter set is in particular usable in the device described above in accordance with FIG. 2. The given parameter set should, however, also be usable in other designs, which for example use a different number of microwave rods and magnetrons. The parameter set is in particular suitable for describing the interaction of the process variables, which are required for forming oxide thicknesses of up to 4.5 nm in a pure oxygen atmosphere at substrate temperatures below 200° C. Depending on the composition of the gas, obviously also other oxide thicknesses may be achieved. For example, by adding an inert gas of up to 90% to $O_2$ or to an $O_2/H_2$ mixture, the required power for generating and maintaining a plasma may be changed. The gas or mixture of gases may also contain $N_2$, NO, $N_2O$, $NH_3$ or $D_2$. Also the use of a cooled grid between the microwave rods and the substrate or a backside cooling of the substrate may influence next to the above mentioned process variables that the substrate temperature does not exceed 200° C.

The invention was described herein above with respect to preferred embodiments of the invention without being limited to the specific embodiments. This is in particular true with respect to the given number of microwave rods and the corresponding number of magnetrons.

The invention claimed is:

1. A method for forming an oxide layer on a substrate, the method comprising:
   generating a plasma adjacent to at least one surface of the substrate, wherein the plasma is generated via microwaves from a gas or a mixture of gases containing oxygen, wherein the microwaves are coupled into the gas, which is contained in a process chamber, by at least one magnetron via at least one microwave rod arranged opposite to the substrate, the microwave rod comprising an outer conductor and an inner conductor;
   setting the following process conditions:
   mean microwave power density in [W/cm²] to $P=0.8\text{-}10$ W/cm²;
   plasma duration in [s] to $t=0.1\text{-}600$ s;
   process chamber pressure in [Pa] to $p=2.67\text{-}266.64$ Pa (20-2000 mTorr);
   distance between substrate surface and microwave rod in [mm] to $d=50\text{-}120$ mm,
   wherein the above and optionally further process conditions are matched to each other such that the substrate is held at a temperature below 200° C. and an oxide growth is induced on the surface of the substrate facing the plasma, wherein the process conditions for an oxide growth of <4.5 nm at a substrate temperature of T<200° C. are set such that the following equation is fulfilled:

$$P^A \cdot t^B \cdot p^C \cdot \exp(-(d-d_0)/\lambda) < K,$$

wherein the parameters of the equation are defined as follows:
$d_0$ is a distance offset in mm in the range of 0-30 mm,
$\lambda$ is a characteristic length in [mm] in the range of 30-120 mm,
A, B and C are choosable coefficients in the range of
A=0.8-1.5;
B=0.5-1.3;
C=-1--0.3, and
K is a constant in the range of 11-4.

2. The method of claim 1, wherein the parameters are in the following ranges:
$d_0=0\text{-}10$ mm;
$\lambda=35\text{-}80$ mm;
A=1-1.2;
B=0.8-1;
C=-0.8--0.7;
K=8-4.

3. The method of claim 1, wherein the parameters have the following values:
$d_0=0$ mm;
$\lambda=70$ mm;

A=1.1;
B=0.9;
C=−⅔;
K=4.

4. The method of claim 1, wherein the mean microwave power density for generating the plasma is at least 1.3 W/cm$^2$.

5. The method of claim 1, wherein the plasma is generated by at least one microwave rod which is supplied with microwaves from a single side, wherein the outer conductor forms an emission opening which widens toward the free end of the electrode.

6. The method of claim 1, wherein the gas contains $O_2$ or $O_2/H_2$ in the order of 6-100%, wherein the rest may be an inert gas selected from the group consisting of Ar, He, Xe, and Kr.

7. The method of claim 1, wherein the Gas contains $N_2$, NO, $N_2O$, $NH_3$ or $D_2$.

8. The method of claim 1, wherein a grid structure is provided between the at least one microwave rod and the substrate, wherein the grid is configured to be cooled to attenuate a heating effect of a plasma on the substrate.

9. The method of claim 1, wherein the substrate is cooled via its backside.

10. The method of claim 1, wherein the semiconductor substrate is a silicon substrate.

* * * * *